United States Patent
Chen et al.

(10) Patent No.: US 8,604,848 B1
(45) Date of Patent: Dec. 10, 2013

(54) MEMS-BASED FREQUENCY SYNTHESIZERS HAVING VARIABLE BANDWIDTH TEMPERATURE COMPENSATION

(75) Inventors: Chien Chen Chen, San Jose, CA (US);
Pavan Kumar Alli, Sunnyvale, CA (US); Yongchou Lo, Cupertino, CA (US); Minhui Yan, San Jose, CA (US); YuanHeng Lo, San Jose, CA (US); Harmeet Bhugra, San Jose, CA (US)

(73) Assignee: Integrated Device Technology inc., San Jose, CA (US)

( * ) Notice: Subject to any disclaimer, the term of this patent is extended or adjusted under 35 U.S.C. 154(b) by 0 days.

(21) Appl. No.: 13/538,719

(22) Filed: Jun. 29, 2012

(51) Int. Cl.
*H03L 7/06* (2006.01)
(52) U.S. Cl.
USPC ............................ 327/156; 327/159; 375/376
(58) Field of Classification Search
USPC .................................... 327/156, 159; 375/376
See application file for complete search history.

(56) References Cited

U.S. PATENT DOCUMENTS

| | | | | |
|---|---|---|---|---|
| 6,420,987 | B1 * | 7/2002 | Schoner et al. | 341/143 |
| 6,518,899 | B2 * | 2/2003 | Yu | 341/118 |
| 7,224,302 | B2 * | 5/2007 | Dornbusch | 341/143 |
| 7,436,227 | B2 * | 10/2008 | Thomsen et al. | 327/147 |
| 7,443,258 | B2 | 10/2008 | Hagelin | |
| 7,446,619 | B2 | 11/2008 | Partridge et al. | |
| 7,449,968 | B1 | 11/2008 | Cioffi et al. | |
| 7,532,081 | B2 | 5/2009 | Partridge et al. | |
| 7,545,228 | B1 | 6/2009 | Lu et al. | |
| 7,755,441 | B1 | 7/2010 | Cioffi et al. | |

* cited by examiner

*Primary Examiner* — Kenneth B. Wells
(74) *Attorney, Agent, or Firm* — Myers, Bigel et al

(57) ABSTRACT

A frequency synthesizer includes a frequency generator configured to generate a periodic output signal in response to a periodic input signal and a temperature-dependent code. A temperature sensor is provided, which is configured to generate a temperature measurement signal in response to detecting a temperature of at least a portion of the frequency synthesizer. A control circuit is provided, which is configured to generate the temperature-dependent code in response to the temperature measurement signal and a plurality of clocks having unequal frequencies. The control circuit can include a cascaded arrangement of an oversampled data converter and a digital filter, which are sequentially responsive to first and second ones of the plurality of clocks during generation of the periodic output signal by the frequency generator.

14 Claims, 7 Drawing Sheets

MEMS-BASED FREQUENCY SYNTHESIZERS HAVING VARIABLE BANDWIDTH TEMPERATURE COMPENSATION

CROSS-REFERENCE TO RELATED APPLICATION

This application is related to U.S. application Ser. No. 13/538,759, filed Jun. 29, 2012, entitled "MEMS-Based Frequency Synthesizers With Enhanced Temperature Compensation", the disclosure of which is hereby incorporated herein by reference.

FIELD OF THE INVENTION

The present invention relates to integrated circuit frequency synthesizers and, more particularly, to frequency synthesizers that utilize microelectromechanical resonators to generate periodic reference signals and methods of operating same.

BACKGROUND OF THE INVENTION

MEMs-based frequency synthesizers frequently utilize techniques to provide temperature compensation, which can counteract temperature-induced variations in resonant frequency of MEMs resonators. As will be understood by those skilled in the art, MEMs resonators may be used as substitutes for piezoelectric crystal resonators and may be more highly integrated with electrical circuitry (e.g., transimpedance amplifiers) using conventional semiconductor fabrication techniques. Examples of conventional MEMs-based frequency synthesizers with temperature compensation are disclosed in U.S. Pat. Nos. 7,449,968 and 7,755,441 to Cioffi et al., entitled "Frequency and Temperature Compensation Synthesis for a MEMs Resonator." Among other things, FIG. 3 of the '968 and '441 patents to Cioffi et al. discloses the use of a temperature sensor to provide an indication of the operating temperature of a MEMs resonator, which is provided to an analog-to-digital (ADC) converter. A conventional ADC converter may utilize an analog delta-sigma ($\Delta\Sigma$) modulator to produce an oversampled output stream of 1-bit digital samples, which can be provided to a digital decimation filter. A digital decimation filter can be used to remove out-of-band quantization noise and unwanted out-of-band signals in the analog input of the modulator. Additional examples of conventional MEMs-based frequency synthesizers with temperature compensation are disclosed in U.S. Pat. Nos. 7,446,619, 7,532,081, 7,443,258 and 7,545,228.

FIGS. 1A-1B illustrate conventional MEMs-based frequency synthesizers 100 that utilize temperature compensation when generating periodic output signals from phase-locked loop (PLL) integrated circuits, which are responsive to periodic input signals derived from MEMs resonators. As shown by FIG. 1A, a MEMs-based frequency synthesizer 100 may include a microelectromechanical resonator circuit 102 containing a trans-impedance amplifier (TIA), which produces a periodic input signal ($F_{IN}$). This periodic input signal $F_{IN}$ is provided to a phase-locked loop (PLL) integrated circuit 104, which operates as a frequency synthesizer to generate a periodic output signal ($F_{OUT}$). As will be understood by those skilled in the art, the frequency of the periodic output signal $F_{OUT}$ is typically much higher than the frequency of the periodic input signal $F_{IN}$, by virtue of the inclusion of a voltage-controlled oscillator (VCO) (not shown) within the forward signal path of the PLL integrated circuit 104. A fractional-N feedback divider 110 is also provided to generate a feedback reference signal (relative to $F_{IN}$). This feedback divider 110 is controlled by the magnitude of a feedback divider number (N), which is generated by a summation device 114. As illustrated, this summation device 114 receives, as operands, a programmable divider number (N1) stored within a register 112 and a divider number adjustment (N2) generated by an analog-to-digital converter (ADC) 108, which performs digital filtering and scaling. This ADC 108 is responsive to a clock signal CLK and an analog temperature sensor output signal $T_S$, which is generated by a temperature sensor 106 that is operably coupled to the MEMs resonator 102. Unfortunately, as illustrated by FIG. 1B, the MEMs-based frequency synthesizer 100 of FIG. 1A may be susceptible to a delayed locking phenomenon caused by the faster locking rate of the phase-locked loop integrated circuit 104 (e.g., <10 ms) relative to the ADC converter 108 (e.g., >100 ms). This delayed settling of the ADC converter 108 in response to a reset or start-up event may result in a relatively large adjustment in the divider number (N2), which may cause the PLL integrated circuit 104 to undergo a disruptive unlock/relock transition and modify the frequency of the periodic output signal ($F_{OUT}$). Thus, notwithstanding the advantages of providing temperature compensation in MEMs-based frequency synthesizers, there continues to be a need to provide enhanced temperature compensation that does not adversely affect PLL locking characteristics.

SUMMARY OF THE INVENTION

A frequency synthesizer according to embodiments of the invention can include a frequency generator, which is configured to generate a periodic output signal in response to a periodic input signal and a temperature-dependent frequency adjusting control signal. A temperature sensor is also provided, which is configured to generate a temperature measurement signal in response to detecting a temperature of at least a portion of the frequency synthesizer. A control circuit is provided, which is configured to generate the temperature-dependent frequency adjusting control signal in response to the temperature measurement signal. This control circuit includes a cascaded arrangement of an oversampled data converter and a multi-stage digital filter, which is configured to generate a plurality of codes from respective ones of the digital filter stages, and a selection circuit, which is configured to use at least first and second ones of the plurality of codes in sequence during first and second consecutive time intervals, respectively, to generate the temperature-dependent frequency adjusting control signal. The oversampled data converter may be a $3^{rd}$ or higher order delta-sigma ($\Delta\Sigma$) modulator. The multi-stage digital filter may include a sinc filter, which is configured to generate the first of the plurality of codes, and a cascaded arrangement of a plurality of half-band finite impulse response (FIR) filters. In particular, the second of the plurality of codes may be generated by one of the plurality of halfband finite impulse response (FIR) filters. In some of the embodiments of the invention, the frequency generator may be configured as a locked-loop integrated circuit and the selection circuit may be configured to use the first of the plurality of codes when the locked-loop integrated circuit is unlocked and the second of the plurality of codes when the locked-loop integrated circuit is locked.

According to further embodiments of the invention, a frequency synthesizer may be provided with a phase-locked loop (PLL) frequency generator. This PLL frequency generator can be configured to generate a periodic output signal in response to a periodic input signal, which can be generated by a microelectromechanical-based frequency generator (e.g., MEMs resonator with trans-impedance amplifier (TIA)). The PLL frequency generator may include a feedback divider, which is responsive to a feedback divider code. A code generation circuit is provided, which is configured to generate the feedback divider code. This code generation circuit may include an analog-to-digital (ADC) converter, which is configured as a cascaded arrangement of a delta-sigma ($\Delta\Sigma$) modulator, and a multi-stage digital filter, which is configured to generate a corresponding plurality of divider codes from the multiple stages thereof. A selection circuit is also provided, which is configured to use a first of the plurality divider codes to generate the feedback divider code when the PLL frequency generator is unlocked and then use a second of the plurality of divider codes to generate the feedback divider code once the PLL frequency generator has become locked.

According to some of these embodiments of the invention, the delta-sigma modulator is a $3^{rd}$ or higher order modulator. The multi-stage digital filter may also include a sinc filter, which is configured to generate the first of the plurality of divider codes, and a cascaded arrangement of a plurality of halfband finite impulse response (FIR) filters. According to these embodiments of the invention, the second of the plurality of divider codes is generated by one of the plurality of halfband finite impulse response (FIR) filters.

A temperature sensor may also be provided, which is configured to generate a temperature measurement signal in response to detecting a temperature of at least a portion of the microelectromechanical-based frequency generator. The ADC converter can be directly responsive to the temperature measurement signal and the temperature measurement signal may be generated in response to detecting a temperature of the MEMs resonator.

Frequency synthesizers according to still further embodiments of the invention include a frequency generator, which is configured to generate a periodic output signal in response to a periodic input signal and a temperature-dependent code. A temperature sensor is also provided, which is configured to generate a temperature measurement signal in response to detecting a temperature of at least a portion of the frequency synthesizer. A control circuit is provided, which is configured to generate the temperature-dependent code in response to the temperature measurement signal and a plurality of clocks having unequal frequencies. The control circuit can include a cascaded arrangement of an oversampled data converter and a digital filter, which are sequentially responsive to first and second ones of the plurality of clocks during generation of the periodic output signal by the frequency generator.

The frequency generator may include a phase-locked loop (PLL) integrated circuit. According to these embodiments of the invention, at least one of the oversampled data converter and the digital filter is responsive to the first of the plurality of clocks when the PLL integrated circuit is unlocked and the second of the plurality of clocks when the PLL integrated circuit is locked. The first of the plurality of clocks has a higher frequency relative to the second of the plurality of clocks.

According to additional embodiments of the invention, a frequency synthesizer may include a frequency generator configured to generate a periodic output signal in response to a periodic input signal. This frequency generator may include a phase-locked loop (PLL) integrated circuit having a feedback divider responsive to a temperature-dependent code. A temperature sensor is provided, which is configured to generate a temperature measurement signal in response to detecting a temperature of at least a portion of the frequency synthesizer. A control circuit is provided, which is configured to generate the temperature-dependent code in response to the temperature measurement signal and a clock having a first frequency when the PLL integrated circuit is unlocked and a second frequency less than the first frequency when the PLL integrated circuit is locked. This control circuit may include a cascaded arrangement of an oversampled data converter and a digital filter.

DETAILED DESCRIPTION OF EMBODIMENTS

Figure 1A:
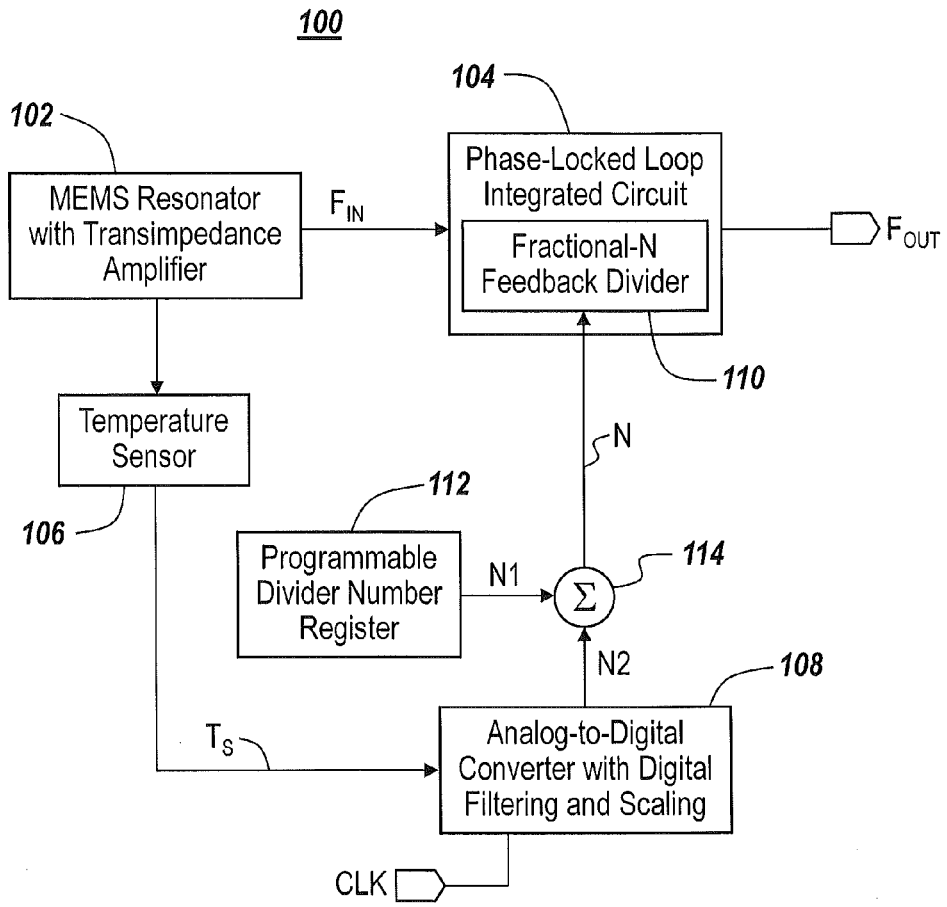
FIG. 1A is a block diagram of a microelectromechanical-based frequency synthesizer according to the prior art.
Figure 1B:
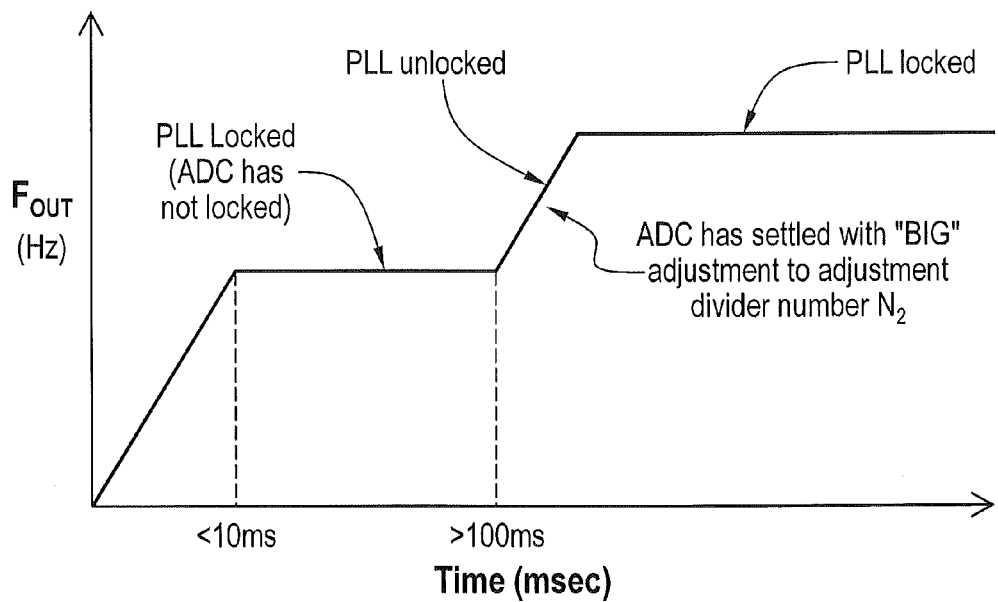
FIG. 1B is a graph of output frequency versus time for the synthesizer of FIG. 1A, which shows how output frequency can change in response to repeated PLL locking events.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that when an element or layer is referred to as being "on," "connected to" or "coupled to" another element or layer (and variants thereof), it can be directly on, connected or coupled to the other element or layer or intervening elements or layers may be present. In contrast, when an element is referred to as being "directly on," "directly connected to" or "directly coupled to" another element or layer (and variants thereof), there are no intervening elements or layers present. Like reference numerals refer to like elements throughout.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2A:
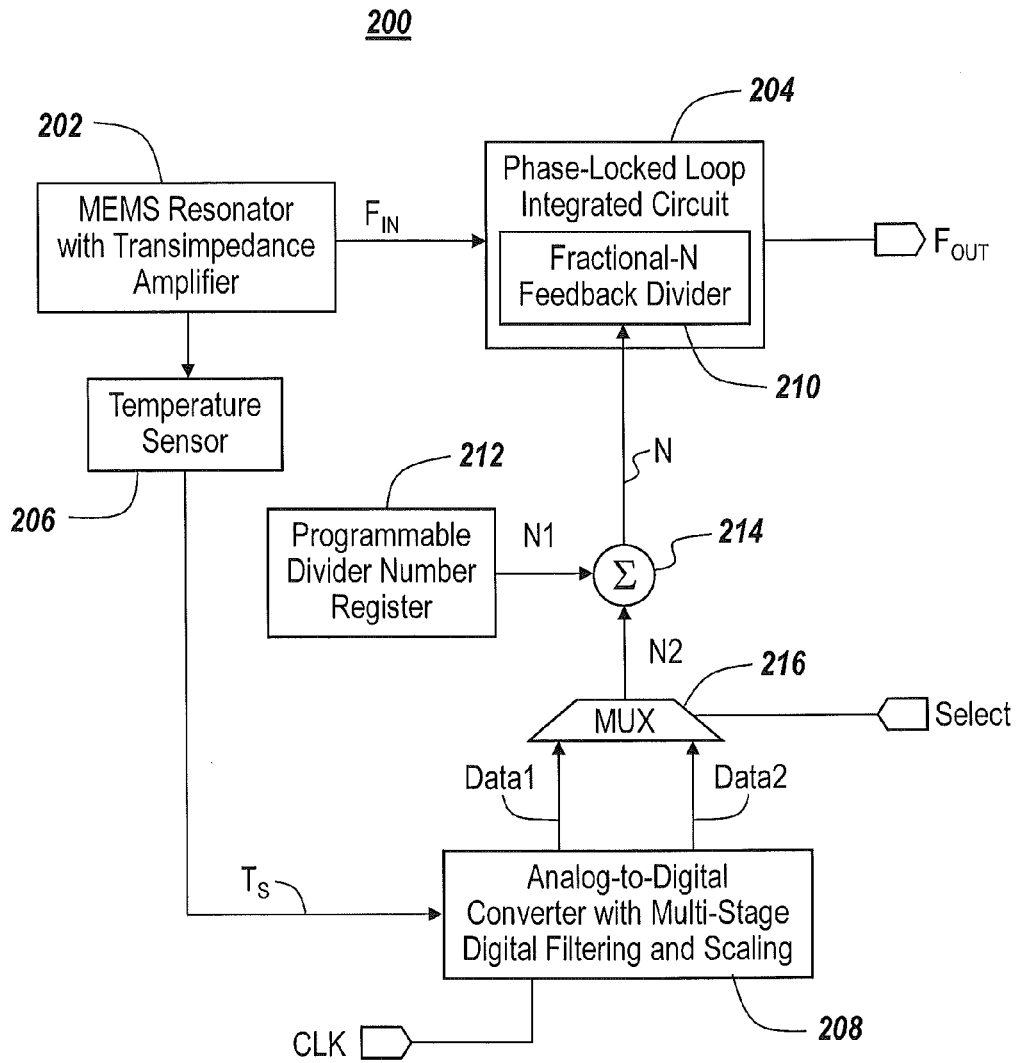
FIG. 2A is a block diagram of a microelectromechanical-based frequency synthesizer according to an embodiment of the present invention.
Figure 2B:
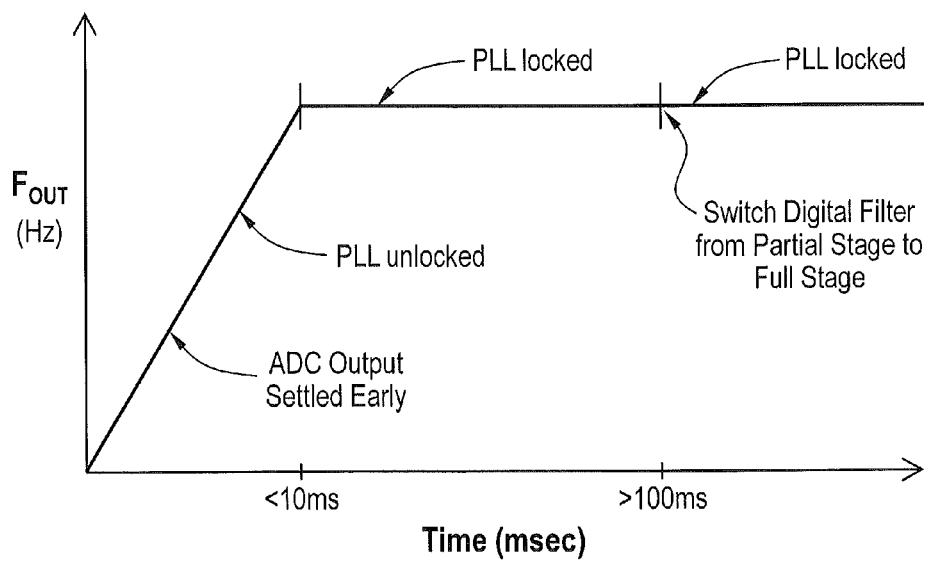
FIG. 2B is a graph of output frequency versus time for the synthesizer of FIG. 2A, which shows how output frequency can be maintained more nearly uniform using a multi-stage digital filter.
Figure 2C:
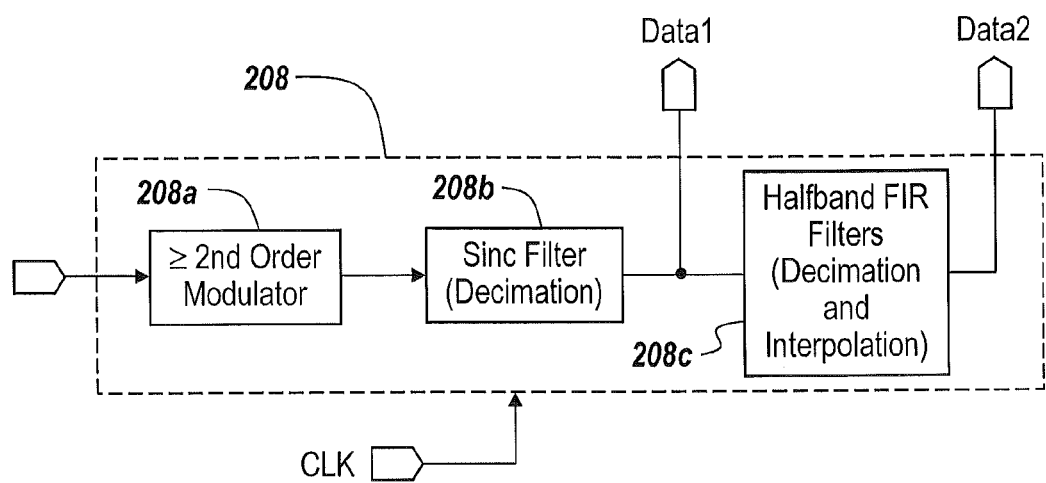
FIG. 2C is a block diagram of an embodiment of the ADC and multi-stage digital filter of FIG. 2A.

Referring to FIGS. 2A-2C, frequency synthesizers according to embodiments of the invention will now be described. As shown by FIG. 2A, a frequency synthesizer 200 can include a frequency generator 204, which is configured to generate a periodic output signal ($F_{OUT}$) in response to a periodic input signal ($F_{IN}$) and a temperature-dependent code N. This periodic input signal ($F_{IN}$) is illustrated as being generated by a MEMs resonator 202, which can include a transimpedance amplifier (TIA) for processing a resonance signal generated by the MEMs resonator 202. A temperature sensor 206 is also provided, which is configured to generate a temperature measurement signal ($T_S$) in response to detecting a temperature of at least a portion of the frequency synthesizer 200. A control circuit is provided, which is configured to generate the temperature-dependent code N in response to the temperature measurement signal ($T_S$). This control circuit includes a cascaded arrangement of an oversampled data converter and a multi-stage digital filter, which is configured to generate a plurality of codes from respective ones of the digital filter stages. The control circuit may also include a selection circuit, which is configured to use at least first and second ones of the plurality of codes in sequence during first and second consecutive time intervals, respectively, to generate the temperature-dependent code N. In particular, as shown by FIG. 2A, the control circuit may include an analog-to-digital (ADC) converter with multi-stage digital filtering and scaling 208, a selection circuit 216, which is shown as a 2-input multiplexer responsive to a selection signal (SELECT), a programmable register 212 containing a base divider number N1 and a summation circuit 214, which adds the base divider number N1 to the temperature-dependent number N2 generated by the 2-input multiplexer. As shown by FIG. 2C, the analog-to-digital (ADC) converter with multi-stage digital filtering and scaling 208 can be configured as a cascaded arrangement of an oversampled data converter 208a and a multi-stage digital filter (208b, 208c), which is configured to generate a plurality of codes (DATA1, DATA2) from respective ones of the digital filter stages. According to preferred aspects of the embodiment of FIG. 2A, the selection circuit 216 may select first and second codes (DATA1, DATA2) in sequence during first and second consecutive time intervals, respectively, to generate the temperature-dependent code N during start-up of the frequency synthesizer 200 and thereafter during normal operation when fluctuations in operating temperature are present.

FIG. 2A further illustrates that the frequency generator 204 may be provided as a phase-locked loop (PLL) frequency generator. As shown, the PLL frequency generator may include a feedback divider 210, which is responsive to a temperature-dependent code "N". A code generation circuit is provided as an embodiment of a control circuit, which is configured to generate the feedback divider code N. This code generation circuit includes an analog-to-digital (ADC) converter, which is configured as a cascaded arrangement of a delta-sigma (ΔΣ) modulator 208a, and a multi-stage digital filter 208b, 208c, which is configured to generate a corresponding plurality of divider codes (DATA1, DATA2) from the multiple stages thereof. A selection circuit is also provided, which is configured to use a first of the plurality divider codes (e.g., DATA1) to generate the feedback divider code N when the PLL frequency generator 204 is unlocked (e.g., at start-up and reset) and then use a second of the plurality of divider codes (e.g., DATA2) to generate the feedback divider code N once the PLL frequency generator 204 has become locked. As further illustrated by the graph of FIG. 2B, the "partial stage" selection of code DATA1 represents an "ADC" output that advantageously settles early before the PLL circuit 204 is locked, whereas the "full stage" selection of code DATA2 represents a more heavily filtered and higher fidelity signal that does not cause unlocking of the PLL circuit 204.

According to some of these embodiments, the ADC converter with multi-stage digital filtering and scaling 208 may be configured as shown by the cascaded arrangement of FIG. 2C, with a $2^{nd}$ or higher order modulator 208a (e.g., delta-sigma (ΔΣ) modulator) and a multi-stage digital filter. This multi-stage digital filter is shown as including a sinc filter 208b and a cascaded arrangement of a plurality of halfband finite impulse response (FIR) filters 208c.

Figure 3A:
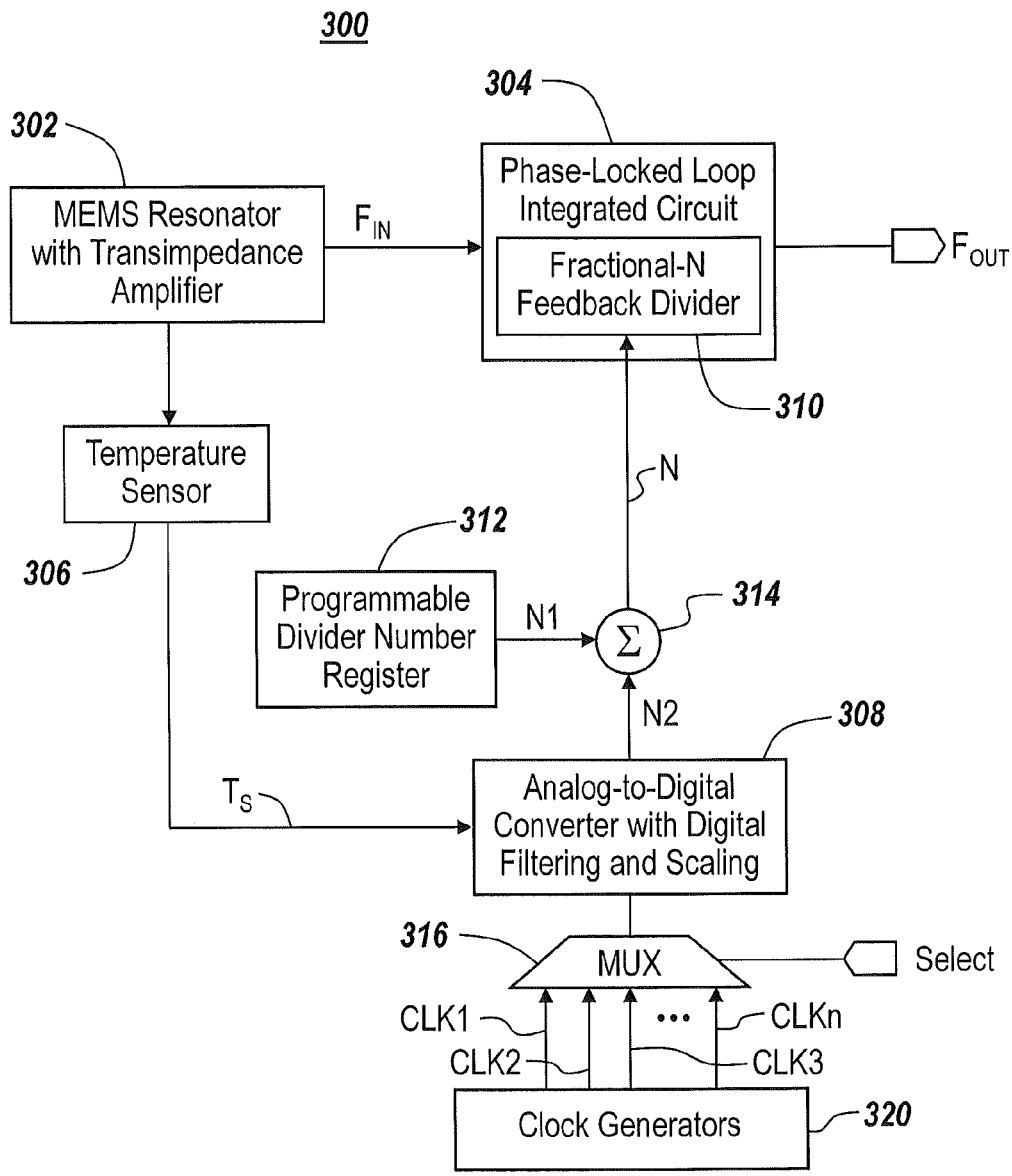
FIG. 3A is a block diagram of a microelectromechanical-based frequency synthesizer according to an embodiment of the present invention.
Figure 3B:
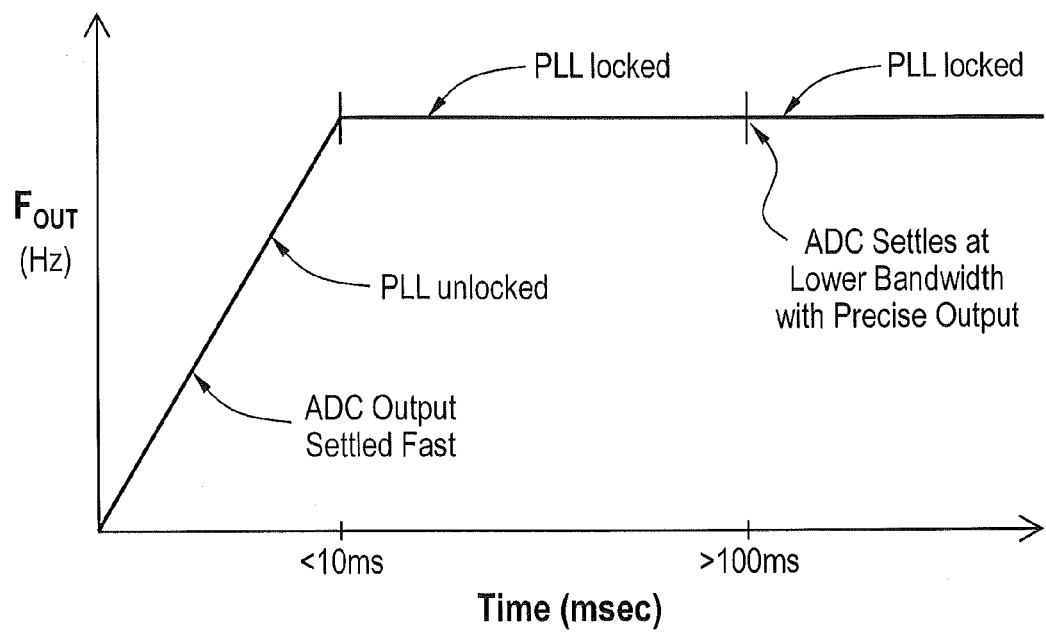
FIG. 3B is a graph of output frequency versus time for the synthesizer of FIG. 3A, which shows how output frequency can be maintained more nearly uniform by driving a control circuit with multiple frequency clocks.

Referring to FIGS. 3A-3B, frequency synthesizers according to additional embodiments of the invention will now be described. As shown by FIG. 3A, a frequency synthesizer 300 can include a frequency generator 304, which is configured to generate a periodic output signal ($F_{OUT}$) in response to a periodic input signal ($F_{IN}$) and a temperature-dependent code N. This periodic input signal ($F_{IN}$) is illustrated as being generated by a MEMs resonator 302, which can include a transimpedance amplifier (TIA) for processing a resonance signal generated by the MEMs resonator 302. A temperature sensor 306 is also provided, which is configured to generate a temperature measurement signal ($T_S$) in response to detecting a temperature of at least a portion of the frequency synthesizer 300. A control circuit is provided, which is configured to generate the temperature-dependent code N in response to the temperature measurement signal ($T_S$). This control circuit is illustrated as including a programmable divider number register 312, a summation device 314, an analog-to-digital converter (ADC) with digital filtering and scaling 308 and a multiplexer 316. A clock generator 320 is also provided, which is configured to generate a plurality of clocks CLK1, . . . , CLKn having different frequencies. As described hereinabove with respect to FIGS. 2A-2C, the control circuit can include a cascaded arrangement of an oversampled data converter and a digital filter 308. However, as shown by FIG. 3A, the cascaded arrangement can be sequentially responsive to first and second ones of the plurality of clocks during generation of the periodic output signal $F_{OUT}$ by the frequency generator 304. This sequential transitioning from one clock, having a relatively high frequency, to a second clock having a relatively low frequency, can be achieved using the multi-frequency clock generator 320 and the MUX 316, which is controlled by a select signal SELECT. Based on this configuration of the control circuit, the feedback divider 310 within the PLL frequency generator 304 may receive a temperature-dependent divider code N by virtue of driving the oversampled data converter and the digital filter with the first of the plurality of clocks (e.g., CLK1) when the PLL frequency generator 304 is unlocked and the second of the plurality of clocks (e.g., CLK2) after the PLL frequency generator 304 becomes locked, where $F_{CLK1} > F_{CLK2} > F_{CLK3}, \ldots > F_{CLKn}$. Accordingly, as illustrated by the timing diagram of FIG. 3B, enhanced higher bandwidth performance can be achieved by using a relatively fast clock during start-up of the frequency synthesizer 300 (e.g., prior to initial locking of the PLL integrated circuit 304) and then switching to a lower frequency clock after the PLL integrated circuit 304 has become locked.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A frequency synthesizer, comprising:
   a frequency generator configured to generate a periodic output signal in response to a periodic input signal and a temperature-dependent code;
   a temperature sensor configured to generate a temperature measurement signal in response to detecting a temperature of at least a portion of the frequency synthesizer; and
   a control circuit configured to generate the temperature-dependent code in response to the temperature measurement signal and a plurality of clocks having unequal frequencies, said control circuit comprising a cascaded arrangement of an oversampled data converter and a digital filter sequentially responsive to first and second ones of the plurality of clocks during generation of the periodic output signal by said frequency generator.

2. The frequency synthesizer of claim 1, wherein said frequency generator comprises a phase-locked loop (PLL) integrated circuit; wherein at least one of the oversampled data converter and the digital filter is responsive to the first of the plurality of clocks when the PLL integrated circuit is unlocked and the second of the plurality of clocks when the PLL integrated circuit is locked; and wherein the first of the plurality of clocks has a higher frequency relative to the second of the plurality of clocks.

3. The frequency synthesizer of claim 2, wherein the oversampled data converter is a 2nd or higher order delta-sigma modulator.

4. The frequency synthesizer of claim 3, wherein the digital filter comprises a sinc filter.

5. The frequency synthesizer of claim 3, wherein the digital filter comprises a cascaded arrangement of a sinc filter and a plurality of halfband finite impulse response (FIR) filters.

6. The frequency synthesizer of claim 1, wherein the frequency synthesizer further comprises a microelectromechanical-based frequency synthesizer configured to generate the periodic input signal; and wherein said temperature sensor is configured to detect a temperature of at least a portion of the microelectromechanical-based frequency synthesizer.

7. The frequency synthesizer of claim 6, wherein the microelectromechanical-based frequency synthesizer comprises a microelectromechanical resonator; and wherein said temperature sensor is configured to detect a temperature of the microelectromechanical resonator.

8. A frequency synthesizer, comprising:
   a frequency generator configured to generate a periodic output signal in response to a periodic input signal, said frequency generator comprising a phase-locked loop (PLL) integrated circuit responsive to a temperature-dependent code;
   a temperature sensor configured to generate a temperature measurement signal in response to detecting a temperature of at least a portion of the frequency synthesizer; and
   a control circuit configured to generate the temperature-dependent code in response to the temperature measurement signal and a clock having a first frequency when the PLL integrated circuit is unlocked and a second frequency less than the first frequency when the PLL integrated circuit is locked, said control circuit comprising a cascaded arrangement of an oversampled data converter and a digital filter.

9. The frequency synthesizer of claim 8, wherein the oversampled data converter is a 2nd or higher order delta-sigma modulator.

10. The frequency synthesizer of claim 8, wherein the digital filter comprises a sinc filter.

11. The frequency synthesizer of claim 8, wherein the digital filter comprises a cascaded arrangement of a sinc filter and a plurality of halfband finite impulse response (FIR) filters.

12. The frequency synthesizer of claim 8, wherein the frequency synthesizer further comprises a microelectromechanical-based frequency synthesizer configured to generate the periodic input signal; and wherein said temperature sensor is configured to detect a temperature of at least a portion of the microelectromechanical-based frequency synthesizer.

13. The frequency synthesizer of claim 12, wherein the microelectromechanical-based frequency synthesizer comprises a microelectromechanical resonator; and wherein said temperature sensor is configured to detect a temperature of the microelectromechanical resonator.

14. The frequency synthesizer of claim 8, wherein the PLL integrated circuit comprises a feedback divider responsive to the temperature-dependent code.

* * * * *